United States Patent [19]
Tsuchiya et al.

[11] 3,941,922
[45] Mar. 2, 1976

[54] FACSIMILE SYSTEM OF RUN-LENGTH

[75] Inventors: Hiroyoshi Tsuchiya; Kunio Yoshida; Yukifumi Tsuda; Heijiro Hayami; Hiroaki Kotera, all of Kawasaki, Japan

[73] Assignee: Matsushita Electric Industrial Co., Ltd., Japan

[22] Filed: Nov. 13, 1973

[21] Appl. No.: 415,332

[30] Foreign Application Priority Data
Nov. 15, 1972 Japan............................ 47-114995
Nov. 15, 1972 Japan............................ 47-115003

[52] U.S. Cl................................. 178/6; 178/DIG. 3
[51] Int. Cl.².......................................... H04N 7/12
[58] Field of Search.......................... 178/DIG. 3, 6; 340/146.3 Z, 347 AD, 206; 324/186; 328/112; 179/15.55 T

[56] References Cited
UNITED STATES PATENTS
| | | | |
|---|---|---|---|
| 3,061,672 | 10/1962 | Wyle.............................. | 178/DIG. 3 |
| 3,366,739 | 1/1968 | Parkinson...................... | 178/DIG. 3 |
| 3,521,241 | 7/1970 | Rumble.......................... | 178/DIG. 3 |
| 3,808,362 | 4/1974 | Tsuda............................ | 178/DIG. 3 |

*Primary Examiner*—Howard W. Britton
*Attorney, Agent, or Firm*—Robert E. Burns; Emmanuel J. Lobato; Bruce L. Adams

[57] ABSTRACT

A transmitter for a facsimile system of run-length type, which comprises a facsimile signal generator, a pulse generator for producing a sampling pulse train, a sampler for sampling each of the space and mark signals with the sampling pulse train, and a coder for converting the sampled space and mark signals into successive binary code signals, the coder including at least two counters and means for selectively operating the two counters. A receiver for facsimile system of run-length type, which comprises a timing pulse generator for producing timing pulses, a demodulator for demodulating modulated binary code signals, a decoder for decoding the binary code signals into binary codes each representing a run-length of one of mark and space signals, a memory circuit for memorizing the binary codes, said memory circuit including at least two registers and means for selectively operating the two registers, and a reconverting circuit for reconverting the binary codes from the memory circuit into one of the mark and space signals.

2 Claims, 79 Drawing Figures

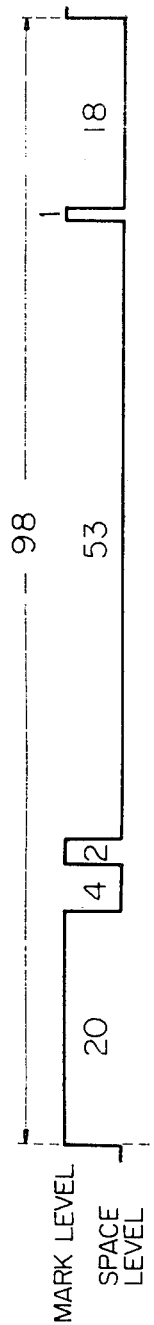
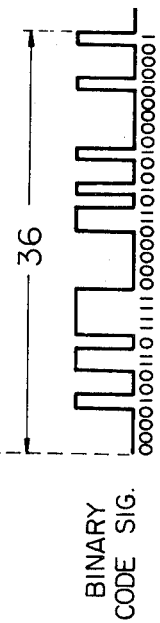

Fig. 3

| n | BINARY CODE |
|---|---|
| 1 | 1 0 |
| 2 | 1 1 |
| 3 | 0 1 0 |
| 4 | 0 1 1 |
| 5 | 0 0 1 0 0 |
| 6 | 0 0 1 0 1 |
| 7 | 0 0 1 1 0 |
| 8 | 0 0 1 1 1 |
| 9 | 0 0 0 1 0 0 0 |
| 10 | 0 0 0 1 0 0 1 |
| ⌇ | |
| 15 | 0 0 0 1 1 1 0 |
| 16 | 0 0 0 1 1 1 1 |
| 17 | 0 0 0 0 1 0 0 0 0 |
| 18 | 0 0 0 0 1 0 0 0 1 |
| ⌇ | |
| 31 | 0 0 0 0 1 1 1 1 0 |
| 32 | 0 0 0 0 1 1 1 1 1 |
| 33 | 0 0 0 0 0 1 0 0 0 0 0 |
| 34 | 0 0 0 0 0 1 0 0 0 0 1 |
| ⌇ | |
| 63 | 0 0 0 0 0 1 1 1 1 1 0 |
| 64 | 0 0 0 0 0 1 1 1 1 1 1 |
| 65 | 0 0 0 0 0 0 1 0 0 0 0 0 0 |
| 66 | 0 0 0 0 0 0 1 0 0 0 0 0 1 |
| ⌇ | |
| 127 | 0 0 0 0 0 0 1 1 1 1 1 1 0 |
| 128 | 0 0 0 0 0 0 1 1 1 1 1 1 1 |
| 129 | 0 0 0 0 0 0 0 1 0 0 0 0 0 0 0 |

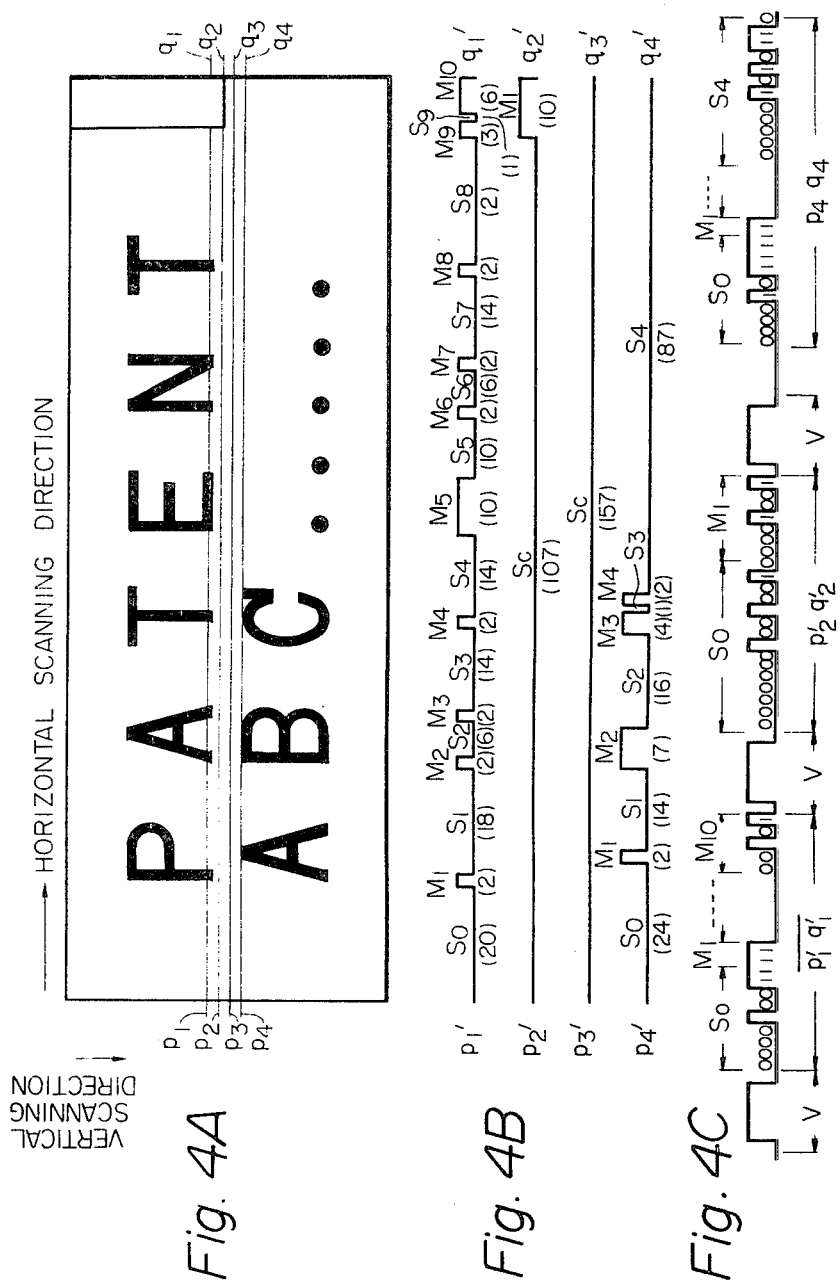

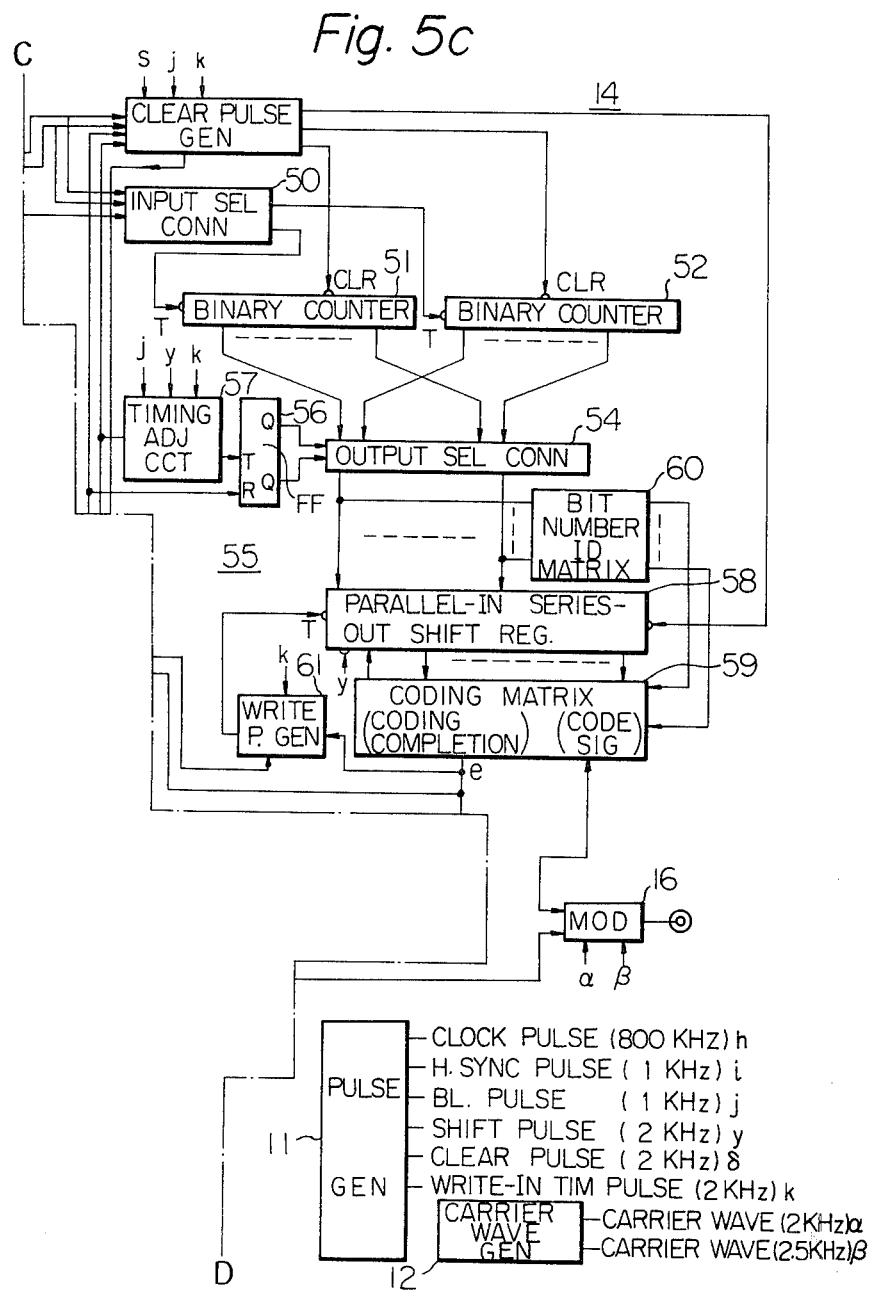

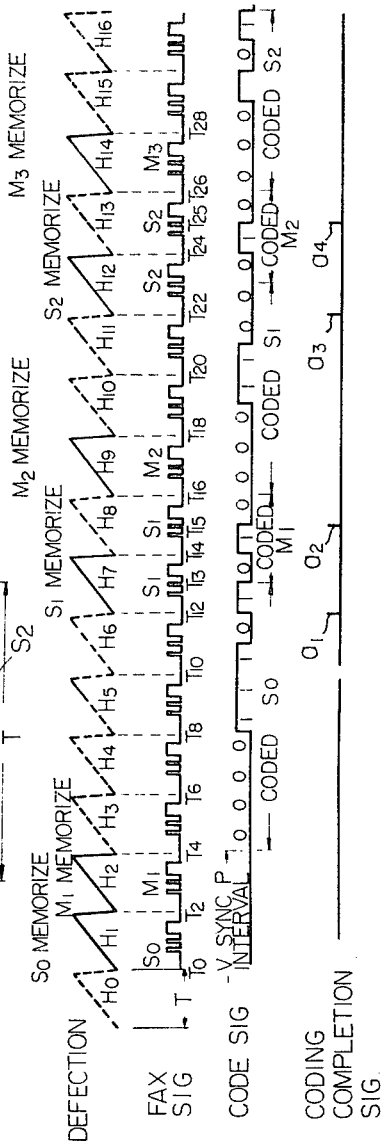

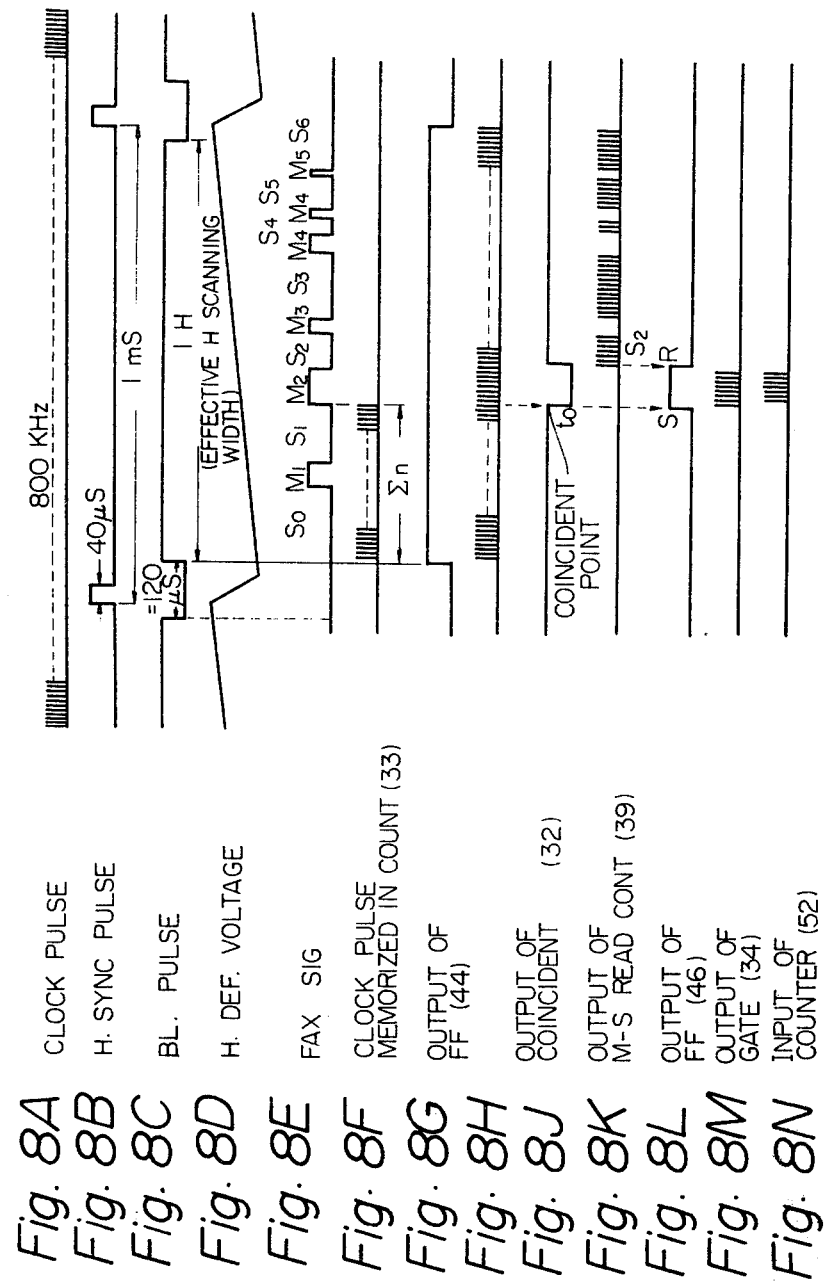

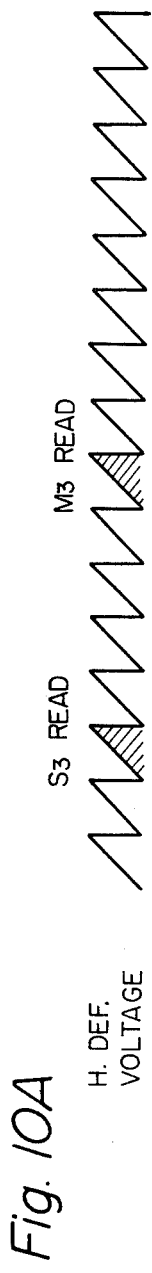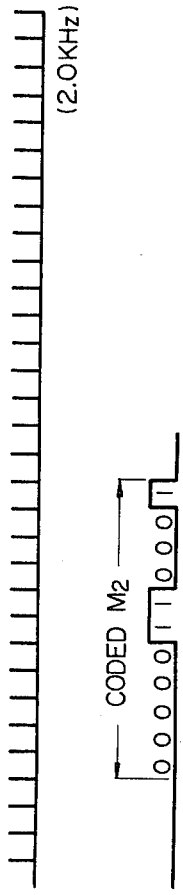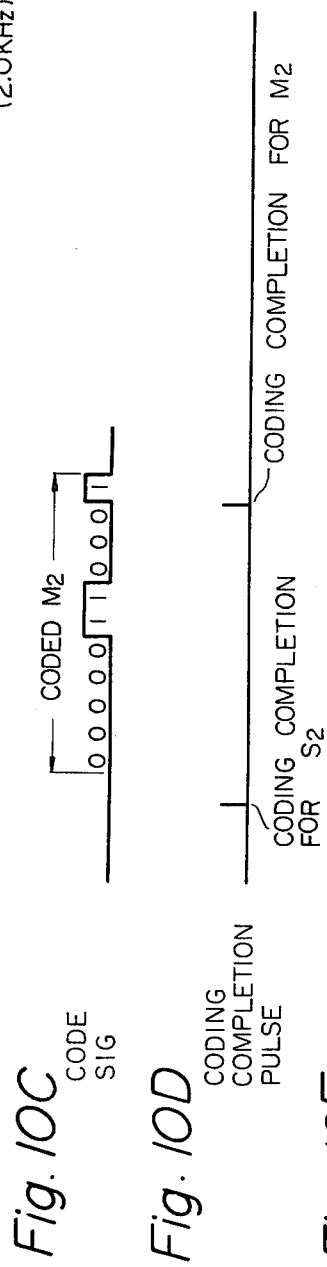
Fig. 10A H. DEF. VOLTAGE
Fig. 10B SHIFT PULSE
Fig. 10C CODE SIG
Fig. 10D CODING COMPLETION PULSE
Fig. 10E OUTPUT OF FF (44)

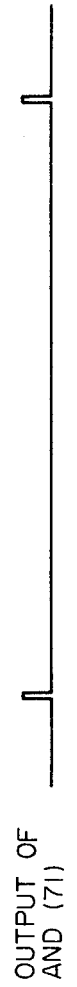
Fig. 12A (y)
Fig. 12B (i)
Fig. 12C (j)
Fig. 12D (δ)
Fig. 12E (k)
Fig. 12F OUTPUT OF AND (71)
Fig. 12G CODING COMPLETION PULSE

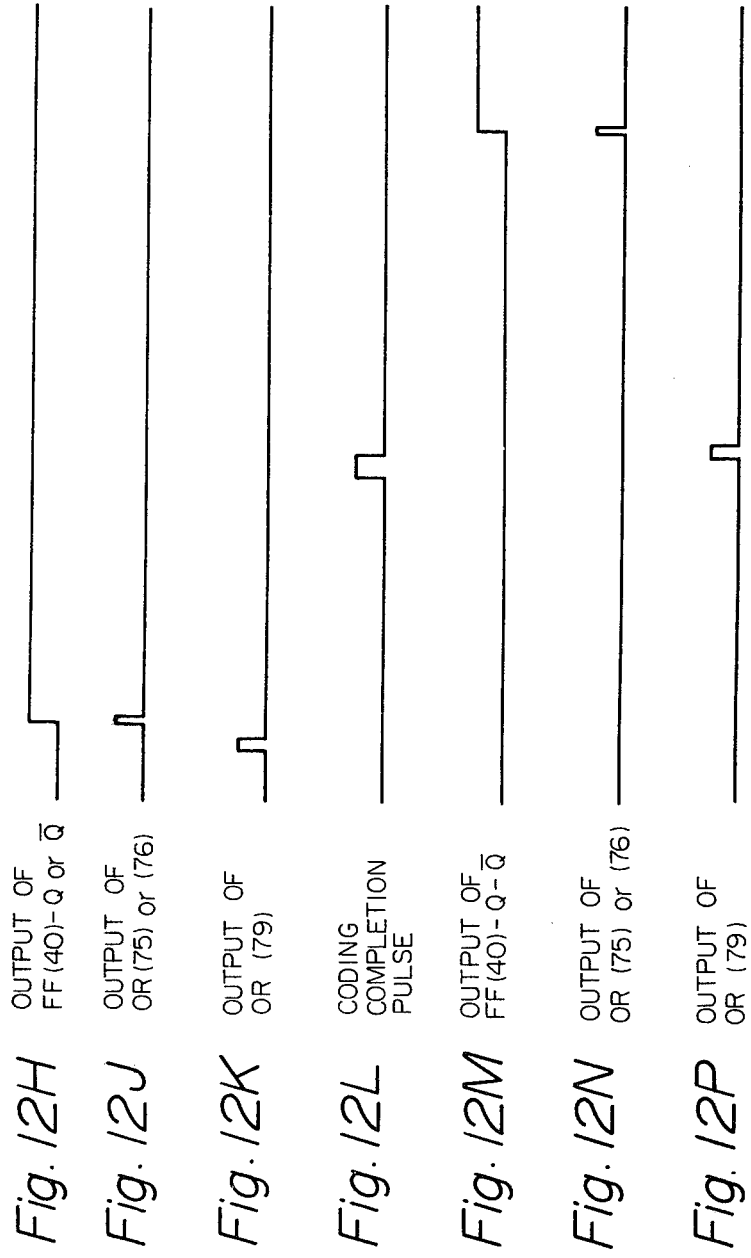

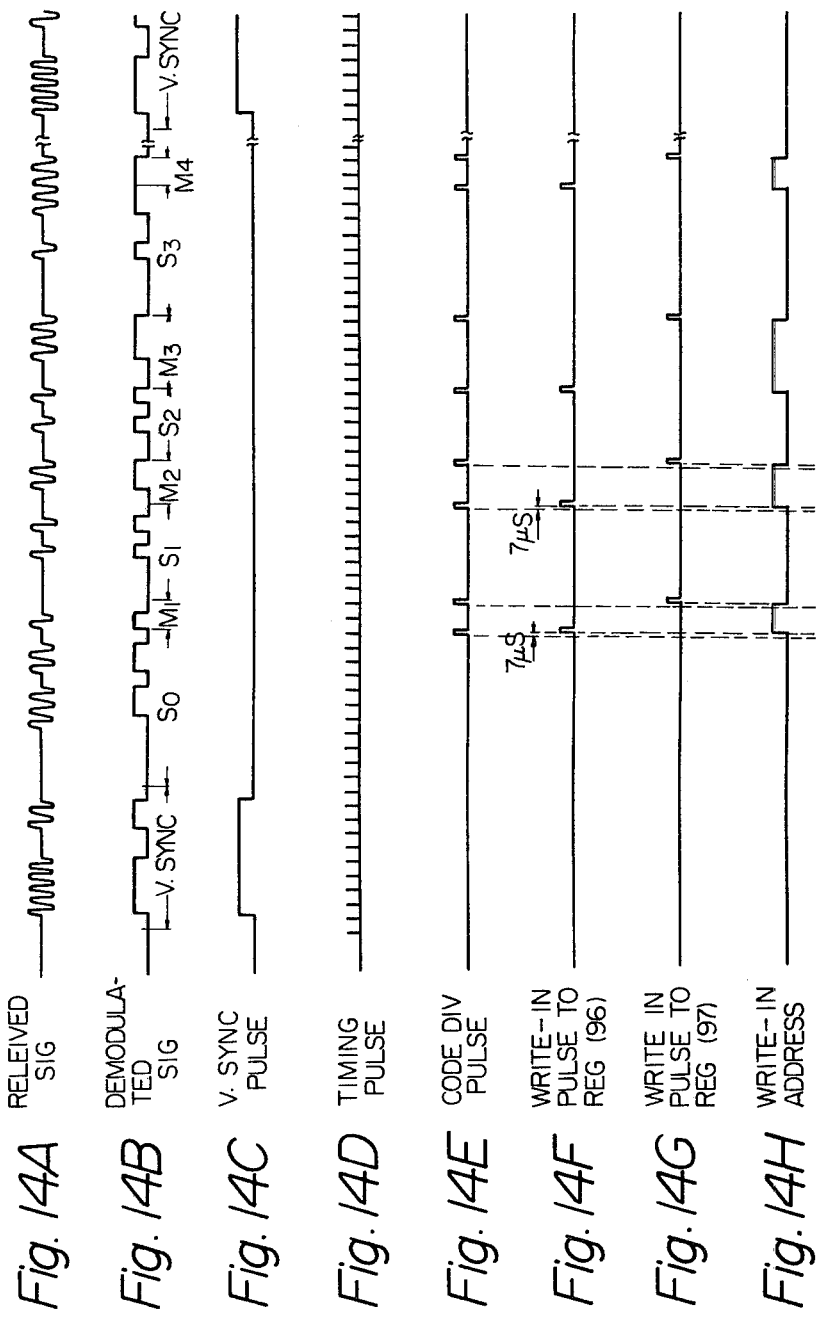

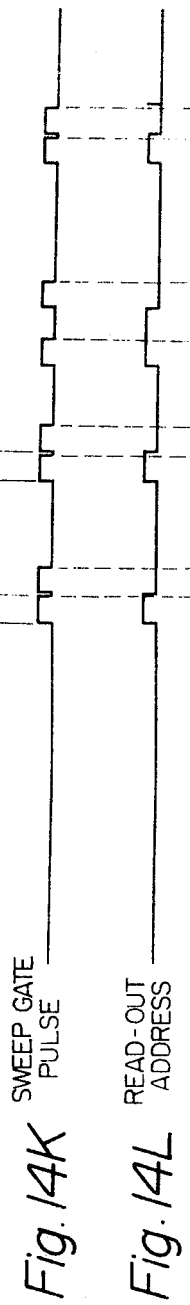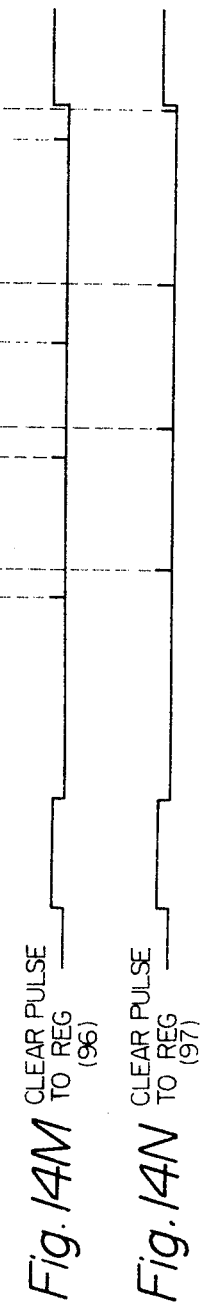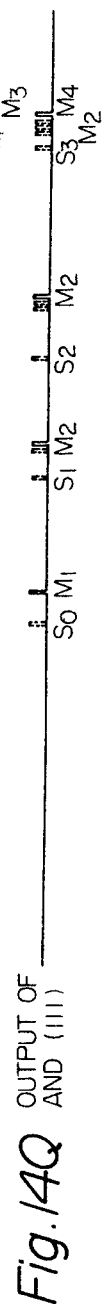
Fig. 14J  H. SYNC PULSE (1 KHz)
Fig. 14K  SWEEP GATE PULSE
Fig. 14L  READ-OUT ADDRESS
Fig. 14M  CLEAR PULSE TO REG (96)
Fig. 14N  CLEAR PULSE TO REG (97)
Fig. 14P  OUTPUT OF M & S CCT (110)
Fig. 14Q  OUTPUT OF AND (111)
Fig. 14R  FOT H. DEFV.

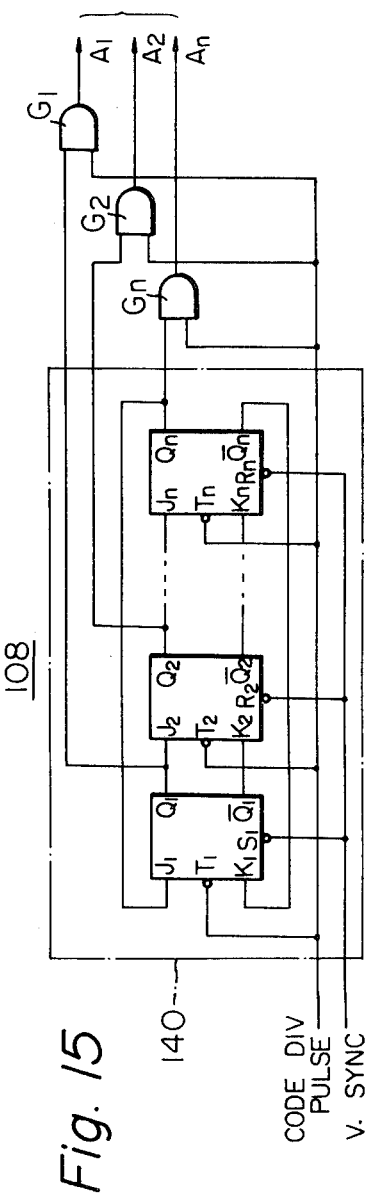
Fig. 15
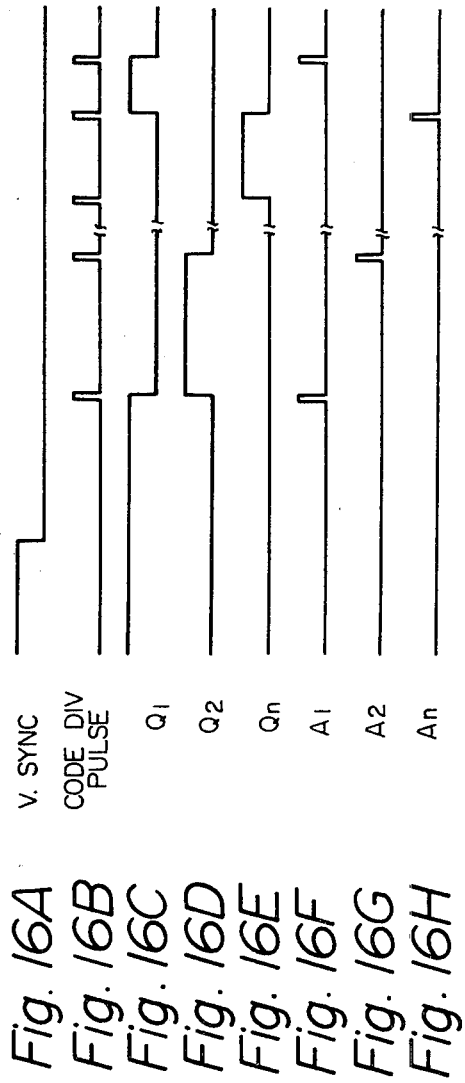
Fig. 16A V. SYNC
Fig. 16B CODE DIV PULSE
Fig. 16C $Q_1$
Fig. 16D $Q_2$
Fig. 16E $Q_n$
Fig. 16F $A_1$
Fig. 16G $A_2$
Fig. 16H $A_n$

FACSIMILE SYSTEM OF RUN-LENGTH

The present invention relates to facsimile systems and more particularly to an improved facsimile system which converts a facsimile signal into successive "run-length" binary code signals, transmits the successive run-length binary code signals, and reconverts the transmitted run-length binary code signals into the original facsimile signal.

A facsimile system generally includes a transmitter for converting a photographic image carried on an information medium such as paper into an electric signal, that is, a facsimile signal and for transmitting the facsimile signal in a suitable form, and a receiver for receiving the transmitted facsimile signal and for reconverting the facsimile signal into the original photographic image information. Since the facsimile signal usually consists of space (white) and mark (black) signals due to the nature of photographic image, it is practically desirable to transmit the facsimile signal in the form of successive suitable code signals thereby to narrow the necessary frequency band width of the transmission channel and to shorten the transmission intervals. Various facsimile system have, therefore, been developed in which the facsimile signal is transmitted in the form of successive code signals. However, the conventional facsimile systems of such type necessitates to previously determine the statistic property of a facsimile signal to be transmitted, which is not always possible. Furthermore, those facsimile systems are complicated in construction and much costly since they necessitate complicated coder and decoder and also buffer memories of large capacities. In order to solve this problem, an improved facsimile system was developed which can dispense with such a large capacity buffer memory. The facsimile system is constructed to store only one run-length of mark or space signal to be transmitted in the form of a code signal, then to encode the stored run-length into a code signal, and to transmit the code signal. Upon completion of the encoding operation, a next space or mark signal is transmitted. Thus, the facsimile system can operate with only one storing means such as counter or registor with only enough capacity to store only one code therein. However, it is a problem in this facsimile system that an increase of the scanning rate of the scanner necessitates an increase in the transmission rate since the transmission rate inherently depends on the scanning rate in this facsimile system. However, as is well known in the art, it is not so easy to increase the scanning rate of the scanner such as CRT.

It is accordingly a principal object of the present invention to provide an improved facsimile system which is simple in construction and accordingly economical.

It is another object of the present invention to provide an improved facsimile system which is capable of transmitting a facsimile signal during relatively short transmission intervals.

For a full understanding of the invention, a detailed description in a preferred form will now given in connection with the accompanying drawings and the features forming the invention will be specifically pointed out in the claims.

In the drawings:

FIG. 1 is a diagram showing a waveform of a facsimile signal;

FIG. 2 is a diagram showing successive binary codes representing the facsimile signal of FIG. 1;

FIG. 3 is a table explaining a coding system employed for the facsimile system according to the present invention;

FIG. 4A is a diagram showing an information medium carrying thereon a photographic image;

FIG. 4B is a diagram showing waveforms produced by scanning with a light spot the information medium of FIG. 4A;

FIG. 4C is a diagram showing a waveform of a facsimile signal transmitted from transmitter of a facsimile system of the invention;

FIGS. 5a, 5b and 5c are block diagrams showing a transmitter according to the invention;

FIG. 6A is a diagram showing an information medium to be processed by the transmitter of FIGS. 5a, 5b and 5c;

FIG. 6B is a diagram showing a waveform of facsimile signal produced by the facsimile signal generator of FIG. 5a;

FIGS. 7A through 7F are diagrams showing waveforms of signals appearing in the transmitter of FIGS. 5a, 5b and 5c;

FIGS. 8A through 8N are diagrams showing waveforms of signals appearing in the transmitter of FIGS. 5a, 5b and 5c;

FIGS. 10A through 10E are diagrams showing waveforms of signals appearing in the transmitter of FIGS. 5a, 5b and 5c;

FIGS. 12A through 12P are diagrams showing waveforms of signals appearing in the circuit arrangement of FIG. 11;

FIGS. 14A through 14R are diagrams showing waveforms of signals appearing in the receiver of FIGS. 13a, 13b and 13c;

FIG. 15 is a diagram showing a circuit arrangement of a part of the receiver of FIGS. 13a, 13b and 13c; and FIGS. 16A through 16H are diagrams showing waveforms of signals appearing in the circuit arrangement of FIG. 15.

Figure 5A:
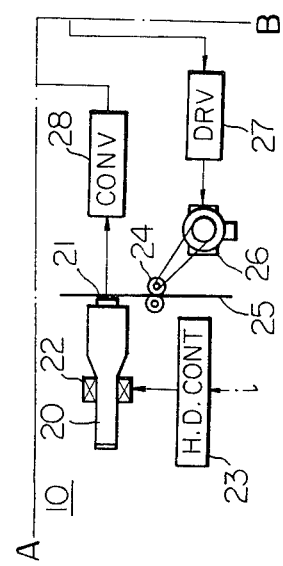

Referring now to the drawings and more specifically to FIG. 1 thereof, there is illustrated a waveform of a facsimile signal representing mark and space images lying on one of "1–H lines". The expression of "1–H lines" means in this specification hypothetical line along each of which a scanning light spot emitted from a scanner moves. It is, in this instance, assumed that the total length of the 1–H facsimile signal is equal to 98 unit times and mark and space signals of the facsimile signal respectively have such lengths as indicated by numerals in this figure. It is now to be noted that a length of each of the mark and space signals is usually called a "run-length."

As being above-mentioned, the facsimile signal is usually converted into a suitable code signal when the facsimile signal is transmitted to the receiver. FIG. 2 shows waveforms of successive binary code signals respectively representing the run-lengths of the mark and space signals of the facsimile signal of FIG. 1. The conversion of the mark and space signals into the successive code signals is performed according to such a coding system as shown in a table of FIG. 3. As being clearly from FIG. 2, the total bits of the binary code signals are merely 36 and it is accordingly apparent that the transmission interval can be largely reduced when the facsimile signal is transmitted in the form of binary code signals.

The coding system shown in the table of FIG. 3 will be explained hereinbelow.

When a run-length ($n$) of an either mark or space signal is equal to or larger than 3 ($n \geq 3$), the binary code representing the run-length ($n$) consists of lower figure digits of a binary code representing ($n-1$) and higher figure digits of one or more 0's the number of which is smaller by one than the number of figure of the binary code of the lower figure digits. When, for example, $n$ is equal to 15, the lower figure digits are given by $n - 1 = 14$ (decimal) $= 1110$ (binary code)

Since the number of figure of the lower figure digits is equal to four, the higher figure digits are 000. Accordingly, when $n = 15$, the binary code according to the present coding system is expressed as 0 0 0     1 1 1 0
(higher)  (lower)

In the case of $n = 1$ and $n = 2$, the corresponding binary codes are defined as follows:

$n = 1 \ldots 1\ 0$ (binary code)
$n = 2 \ldots 1\ 1$ (binary code)

The above-explained coding system is advantageous in that a binary code according to this coding system is shorter in time that that of the corresponding run-length except in the case of $n = 1, 2, 3,$ or $5$. When, for example $n = 100$, the corresponding binary code is shorter than the run-length by a rate of 13/100 ($\approx 1/7.7$). When $n = 500$, the corresponding binary code is shorter than the run-length by a rate of 17/500 ($\approx 1/29.4$).

It is now to be understood that the abovementioned coding system is effective for reducing the transmission interval especially in the case of a space signal.

When photographic image information carried on an information medium in such a manner as illustrated in FIG. 4A is scanned along 1-H lines $p_1q_1$, $p_2q_2$, $p_3q_3$ and $p_4q_4$, facsimile signals indicated by $p_1'q_1'$, $p_2'q_2'$, $p_3'q_3'$ and $p_4'q_4'$ in FIG. 4B are produced in the transmitter, which facsimile signals consist of space signals $S_0$, $S_1$, $S_2, \ldots$, and mark signals $M_1$, $M_2$, $M_3, \ldots$, respectively having run-lengths indicated by parenthesized numerals. The facsimile signals are then converted into successive binary code signals as shown in FIG. 4C, wherein pulses V are vertical synchronizing pulses separating the binary code signals corresponding to an 1-H facsimile signal from one another.

Figure 5B:
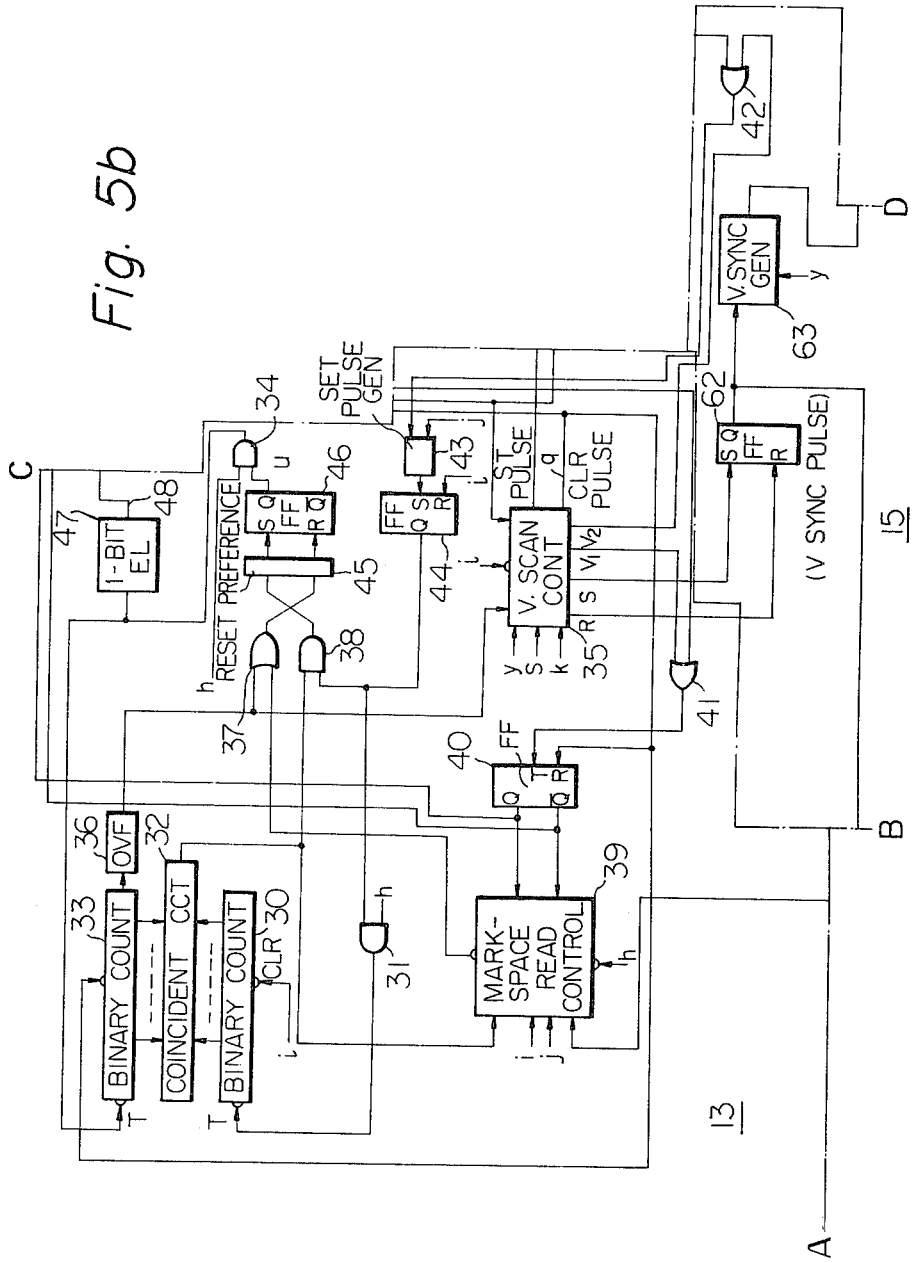

In FIGS. 5a, 5b and 5c, there is shown a preferred example of a transmitter of a facsimile system according to the present invention, which generally comprises a facsimile signal generator 10 for producing a facsimile signal representing photographic image information, a pulse generator 11 for producing a clock pulse train $h$, a horizontal synchronizing pulse train $i$, a blanking pulse train $j$, a shift pulse train $y$, a clear pulse train $\delta$ and a write-in timing pulse train $k$, a carrier wave generator 12 for producing carrier wave ($\alpha$) and ($\beta$), a run-length pulse generator 13 for producing run-length pulse signals each representing a run-length of each of mark and space signals of the facsimile signal, a coder 14 for coding each of the run-length pulse signals into a binary code signal, a vertical synchronizing pulse signal generator 15 for producing a vertical synchronizing pulse signal, and a modulator 16 for mixing the code signal and the vertical synchronizing pulse signal and modulating the carrier waves with the mixed code and vertical synchronizing pulse signals. The facsimile signal generator 10 is preferably composed of a fibre optics cathode-ray tube 20 having a fibre optics faceplate 21 and a horizontal deflection element 22. A horizontal deflection control circuit 23 is adapted to produce a horizontal deflection signal in accordance with the horizontal synchronizing pulse train $i$. A feed means 24 such as a pair of drive rollers is arranged to feed an information medium 25 carrying thereon a photographic image in close proximity to the fibre optics faceplate 21. The feed means 24 is actuated by a prime mover 26 such as an electric pulse motor which is driven by a driver 27 when the driver 27 is energized by the vertical synchronizing pulse signal. A photoelectric converter 28 is positioned in the vicinity of the fibre optics faceplate 21, so that the converter 28 converts the light-spot reflected from the information medium into an electric signal, that is, the facsimile signal.

The run-length pulse generator 13 includes a binary counter 30 having an input trigger terminal connected to an output of an AND gate 31 and a clear terminal connected to a horizontal synchronizing pulse terminal of the pulse generator 11. The counter 30 further has a plurality of output terminals connected to first group of input terminals of a coincident circuit 32. The coincident circuit 32 further has a second group of input terminals connected to a plurality of output terminals of a binary counter 33 which has an input trigger terminal connected to an output of an AND gate 34 and a clear terminal connected to a clear pulse output terminal of a vertical scanning controller 35. The vertical scanning controller 35 is so arranged as to produce various pulse signals in response to the horizontal synchronizing pulse train $i$, the shift pulse train $y$, the clear pulse train ($\delta$), the write-in timing pulse train $k$ and a coding completion signal from the coder 14. The binary counter 33 has an overflow output terminal through which an overflow signal is produced when the binary counter 33 overflows. The overflow output terminal of the counter 33 is connected to an overflow register 36 which produces an overflow pulse of a suitable pulse width when triggered by the overflow signal. The output terminal of the overflow register 36 is connected to one input of an OR gate 37 and also to an input terminal of the vertical scanning controller 35. The coincident circuit 32 has an output terminal connected to one input of an AND gate 38 and to an input terminal of a mark and space read controller 39. The mark and space read controller 39 further has input terminals connected to the pulse generator 11 for receiving the clock pulse train $h$, the horizontal synchronizing pulse train $i$ and the blanking pulse train $j$, and another input terminal connected to the photo-electric converter 28 of the facsimile signal generator 10 for receiving the facsimile signal. The mark-space read controller 39 further has a pair of input terminals connected to output Q and $\overline{Q}$ terminals of a flip-flop circuit 40 which serves as a mark and space identifying circuit and, namely, produces a logic 1 signal on the output $\overline{Q}$ terminal when the run-length pulse generator 13 ought to treat a mark signal of the facsimile signal and a logic 1 signal on the output Q terminal when the run-length pulse generator 13 ought to treat a space signal. The reset terminal of the flip-flop circuit 40 is connected to the reset pulse output terminal of the vertical scanning controller 35. The trigger terminal of the flip-flop circuit 40 is connected to an output of an OR gate 41 which has its one input connected to an output terminal $V_1$ through which the vertical scanning controller 35 produces pulses each appearing a 1-H interval as early as it produces one of reset pulses on its reset pulse output terminal R. The vertical scanning controller 35 also produces on an output terminal $V_2$ a pair of pulses one of which appears a 2-H interval as early as it produces the reset pulse and the other of which appears at the same time as the single pulse appears on the output terminal $V_1$. The vertical scanning controller 35 also produces on a start pulse output terminal start pulses each appearing at the same time as each of the reset pulses and on a set pulse output terminal S set pulses each appearing at a moment an interval V before the reset pulse appears. The interval V is equal to the pulse width of the vertical synchronizing pulse. The output terminal $V_2$ of the vertical scanning controller 35 is connected to one input of an OR gate 42 which has an output connected to an input terminal of a set pulse generator 43. The set pulse generator 43 has another input terminal connected to the blanking pulse output terminal of the pulse generator 11. The set pulse generator 43 produces a set pulse rising up at the trailing edge of a blanking pulse appearing just after the pulse applied thereto from the OR gate 42. The set pulse from the set pulse generator 43 is applied to a set terminal of a flip-flop circuit 44 which is reset by the horizontal synchronizing pulse signal. The flip-flop circuit 44 has its output Q terminal connected to the other input of the AND gate 38 and to one input of the AND gate 31 the other input of the AND gate 31 is connected to the clock pulse output terminal of the pulse generator 11. Outputs of the OR gate 37 and the AND gate 38 are respectively connected by way of a reset preference circuit 45 to reset and set terminals of a flip-flop circuit 46. The flip-flop circuit 46 has its output Q terminal connected to one input of the AND gate 34 the other input of which is connected to the clock pulse output terminal. The output of the AND gate 34 is also connected to a 1-bit eliminator 47 which eliminates one pulse of each run-length pulse signal applied thereto.

The coder 14 includes an input selective connector 50 for selectively connecting the output terminal 48 of the 1-bit eliminator 47 to trigger terminals of two binary counters 51 and 52 in accordance with the output signals from the mark and space identifying circuit 40 of the run-length pulse generator 13. The coder 14 further includes a clear pulse generator 53 which is arranged to clear alternately the binary counters 51 and 52 in response to the output signals of the mark and space identifying circuit 40, the clear pulse from the vertical scanning controller 35 and the coding completion signal, the blanking pulse train and the write-in timing pulse train. The coder 14 further includes an output selective connector 54 which is arranged to selectively connect the output terminals of the counters 51 and 52 to input terminals of a converting circuit 55 in response to output signals of a flip-flop circuit 56. The flip-flop circuit 56 is adapted to be reset by the clear pulse from the vertical scanning controller 35 and to be triggered by an output signal from a timing adjustment circuit 57. The timing adjustment circuit 57 produces the output signal in response to the coding completion signal and the timing pulse signals from the pulse generator 11. The converting circuit 55 includes a parallel-in series-out shift register 58 having a plurality of input terminals to be connected by way of the output selective connector 54 to one of the output terminals of the binary counters 51 and 52. Output terminals of the parallel-in series-out shift register 58 are connected to input terminals of a coding matrix 59. A bit or digit number identifying matrix 60 has input terminals connected to the input terminals of the shift register 58 and output terminals connected to the coding matrix 59. The bit number identifying matrix 60 furnishes the coding matrix 59 with information as to the digit or bit number of a binary run-length signal passed through the output selective connector 54. The coding matrix 59 converts the binary run-length signal from the shift register 58 into a binary code signal. The coding matrix 59 is adapted to produce the coding completion signal upon completion of its coding operation. The shift register 58 receives and memorizes run-length signal through the output selective connector 54 when it is triggered by a write-in pulse applied from a write-in pulse generator 61. The write-in pulse generator 61 produces the write-in pulse in response to the coding completion signal from the coding matrix 59 and the 1-H start pulse from the vertical scanning controller 35.

The vertical synchronizing pulse generator 15 includes a flip-flop circuit 62 having its set and reset terminals respectively connected to the output terminals S and R of the vertical scanning controller 35, so that the flip-flop circuit 62 produces vertical synchronizing pulses each rising up and down at the leading edges of the set and reset pulses from the output terminals S and R of the vertical scanning controller 35. The vertical synchronizing pulse generator 15 further includes a vertical synchronizing code signal generator 63 for converting each of the vertical synchronizing pulses into a vertical synchronizing code signal.

With reference to FIGS. 6A through 7F, the general operation of the transmitter of FIG. 5 will be explained hereinbelow.

When the information medium 25 carries thereon such photographic images as shown in FIG. 6A and the information medium 25 is horizontally scanned with a light spot emitted from the cathode-ray tube 20 along a 1-H line $pq$, the photo-electric converter 28 produces a faximile signal having such a waveform as shown in FIG. 6B. As seen from FIG. 6B, the facsimile signal consists of space signals $S_0$, $S_1$, $S_2$ and $S_3$, and mark signals $M_1$, $M_2$ and $M_3$. The space and mark signals respectively has such run-lengths as indicated by parenthesized numerals. It is now assumed that the time period of 1-H is equal to a time period T. When the horizontal deflection circuit 23 produces a sawtooth wave horizontal deflection voltages having such a waveform as illustrated with solid and broken lines $H_1$, $H_2$, $H_3$, ... and $H_{16}$ in FIG. 7A, the photo-electric converter 28 repeatedly produces the 1-H facsimile signal of FIG. 6B as shown in FIG. 7B until the vertical synchronizing pulse signal is applied to the driver 27. The run-length pulse generator 13 receives the mark and space signals and produces run-length pulse signals each representing a run-length of each of the mark and space signals. When, for example, a mark or space signal has a run-length of $n$ unit time periods, a run-length pulse signal consists of an $(n-1)$ number of the clock pulses. The input selective connector 50 of the coder 14 first connects the output terminal 48 of the 1-bit eliminator 47 of the run-length pulse generator 13 to the trigger input terminal of the binary counter 51, so that the binary counter 51 counts the number of clock pulses of the run-length pulse signal corresponding to the space signal $S_0$ during the horizontal scanning period $H_1$. Thereafter, the input selective connector 50 connects the output terminal 48 of the 1-bit eliminator 47 to the trigger input terminal of the binary counter 52 in response to an output signal of the flip-flop circuit 40, so that the binary counter 52 receive a run-length pulse signal representing the mark signal $M_1$ and counts the number of clock pulses of the run-length pulse signal during the horizontal scanning period $H_2$. As seen from FIG. 7C, vertical synchronizing pulse interval ends at the end of the horizontal scanning time period $H_2$ and accordingly the vertical scanning controller 35 produces a clear pulse on its clear pulse output terinal. In some cases, the vertical synchronizing pulse interval ends at an intermediate point of a horizontal scanning time period. The clear pulse is applied to the reset terminal of the flip-flop circuit 56 which then produces a logic "1" signal on its $\overline{Q}$ terminal, so that the output selective connector 54 connects the output terminals of the binary counter 51 to the input terminals of the shift register 58 and of the bit number identifying matrix 60. At this instant, the vertical scanning controller 35 produces a start pulse on its start pulse output terminal, so that the write-in pulse generator 61 produces a write-in pulse which triggers the shift register 58. Thus, the shift register 58 receives the binary code information from the binary counter 51. The coding matrix 59, on the other hand, selects one out of the output terminals of the shift register in accordance with the bit number information applied thereto from the bit number identifying matrix 60. Since the shift register 58 is triggered by the shift pulse train $y$, the shift register 58 serially conveys the binary code information through the selected one matrix 59 which then produces a binary code signal having a waveform as shown in FIG. 7C from a moment $T_4$ to a moment $T_{13}$. When the coding matrix 59 completes its coding operation for the space signal $S_0$, the coding matrix produces a coding completion pulse as indicated by $a_1$ in FIG. 7D. Since the code completion pulse $a_1$ is applied by way of the OR gate 42 to the set pulse generator 43, the set pulse generator 43 produces a set pulse which causes the flip-flop circuit 44 produces a logic 1 signal. Thus, the run-length pulse generator 13 commences to produce a run-length pulse signal representing the space signal $S_1$. The coding completion pulse $a_1$ is also applied by way of the OR gate 41 to the trigger terminal of the flip-flop circuit 40 which then produces a logic 1 signal on its $\overline{Q}$ terminal. The coding completion signal is further applied to the clear pulse generator 53 which then clear the binary counter 51 in accordance with the logic 1 signal from the $\overline{Q}$ terminal of the flip-flop circuit 40. The logic 1 signal from the $\overline{Q}$ terminal of the flip-flop circuit 40 is also applied to the input selective connector 50 which then connects the output terminal 48 of the 1-bit eliminator 47 to the trigger input terminal of the binary counter 51. The binary counter 51 then receives the run-length pulse signal representing the space signal $S_1$. On the other hand, the coding completion pulse $a_1$ is also applied to the timing adjusting circuit 57 which then triggers the flip-flop circuit 56 in accordance with the blanking pulse train $j$, the shift pulse train $y$ and write-in pulse train $k$. The flip-flop circuit 56 then produces a logic 1 signal on its Q terminal so that the output selective connector 54 connects the output terminals of the binary counter 52 to the input terminals of the shift register 58 and the bit number identifying matrix 60, whereby the converting circuit 55 produces a binary code signal representing the mark signal $M_1$ from the moment $T_{13}$ to a moment $T_{16}$ as shown in FIG. 7C. When the coding matrix 59 completes its coding operation for the mark signal $M_1$, the coding matrix 59 produces a coding completion pulse as indicated by $a_2$ in FIG. 7D. Thereafter, the transmitter repeats the same operation as described above thereby to produce successive binary code signals representing the space signals $S_1$, $S_2$ and $S_3$ and the mark signals $M_2$ and $M_3$ while producing coding completion pulses $a_3$, $a_4$, etc.

As being mentioned above, the flip-flop circuit 62 of the vertical synchronizing pulse generator 15 produces a vertical synchronizing pulse train in response to the output signals from the output terminals R and S of the vertical scanning controler 35. The vertical synchronizing pulse is applied not only to the driver 27 but also to the vertical synchronizing code signal generator 63 which then produces a vertical synchronizing code signal representing a binary code of, for example, 0111100110. The modulator 16 mixes the vertical synchronizing code signals and the binary code signals as illustrated in FIG. 7E and modulates the carrier waves $\alpha$ and $\beta$ as illustrated in FIG. 7F. As seen from FIG. 7F, the modulator 16 permits the carrier wave $\beta$ of 2.5KHz to carry leading portion of the vertical synchronizing code signal and the carrier wave $\alpha$ of 2KHz to carry a trailing portion of the vertical synchronizing code signal while permitting the carrier wave $\alpha$ to carry the code signals. As a result, it is readily performed in the receiver side to separate the vertical synchronizing pulses from the code signals and to correctly demodulate the modulated code signals.

Referring now to FIGS. 8A through 8N, the operation of the facsimile signal generator 10, the pulse generator 11 and the run-length pulse signal generator 13 will be explained hereinbelow in more detail.

The pulse generator 11 produces clock pulses of a repetition frequency 800KHz as seen from FIG. 8A and horizontal synchronizing pulses appearing at a repetition time duration of 1 ms and each having a pulse width of 40$\mu$s as seen from FIG. 8B. In FIG. 8C, there is illustrated blanking pulses each having a pulse width of about 120 $\mu$s. It is now to be noted that the trailing edge of a blanking pulse and the leading edge of the succeeding blanking pulse are apart from each other by the effective horizontal scanning width as clearly shown in FIG. 8C. Accordingly, the horizontal deflection circuit 23 produces a horizontal deflection voltage having such a waveform as shown in FIG. 8D. Accordingly, the photo-electric converter 28 repeatedly produces facsimile signals each having such a waveform as shown in FIG. 8E, until the driver 27 is energized by a vertical synchronizing pulse from the vertical synchronizing pulse generator 15. In this case, the facsimile signal consists of space signals $S_0$, $S_1$, $S_2$, $S_3$, $S_4$, $S_5$ and $S_6$, and mark signals $M_1$, $M_2$, $M_3$, $M_4$, $M_5$ and $M_6$.

Since the binary counter 33 is triggered by clock pulses from the AND gate 34, that is, sampling pulses each sampling mark or space signals of the facsimile signal, the binary counter 33 accumulatively memorizes a number of the clock pulses passed through the AND gate 34. When it is now assumed that the run-length pulse signal generator 13 has accomplished to sampling the space signals $S_0$ and $S_1$ and mark signals $M_1$, the binary counter 33 memorizes therein an $n$ number of clock pulses, that is, sampling pulses as illustrated in FIG. 8F. When the coding matrix 59 completes its coding operation for the mark signal $M_1$, the coding matrix 59 produces the coding completion pulse which is applied by way of the OR gate 42 to the set pulse generator 44. The set pulse generator 44 then sets at the trailing edge of the blanking pulse the flip-flop circuit 44 which then produces a gate pulse lasting pending the leading edge of the succeeding horizontal synchronizing pulse, as shown in FIG. 8G. The gate pulse from the flip-flop circuit 44 is applied to the AND gate 31 which then passes therethrough such clock pulses as shown in FIG. 8H. The clock pulses passed through the AND gate 31 are counted by the binary counter 30. Since, in this instance, the binary counter 33 has memorized the $n$ number of clock pulses, the coincident circuit 32 produces a coincident pulse falling down at a coincident point $t_0$ as shown in FIG. 8J. The coincidence pulse is applied to one input of the AND gate 38 which then produces a logic 1 signal because it is triggered by the gate pulse from the flip-flop circuit 44. The logic "1" signal is applied by way of the reset preference circuit 45 to the set terminal of the flip-flop circuit 46 which then produces a logic 1 signal on its Q terminal. Since, on the other hand, the coincidence pulse is also applied to the mark-space read controller 39, the mark-space read controller 39 commences to sample according to the indication by the flip-flop circuit 40 only the space signals of the facsimile signal applied thereto from the photo-electric converter 28 with the clock pulse train. Thus the clock pulses sampling space signals appear on the output terminal of the markspace read controler 39 in such a manner as shown in FIG. 8K. The output pulses from the controler 39 are applied through the OR gate 37 and the reset preference circuit 45 to the reset terminal of the flip-flop circuit 46 which is then reset by the leading pulse of the output pulses from the controler 39 and accordingly produces a gate pulse having such waveform as shown in FIG. 8L. Namely, the gate pulse from the flip-flop circuit 46 rises up at the leading edge of the coincidence pulse and falls down at the leading clock pulse from the mark-space read controler 39. Thus, the AND gate 34 passes therethrough clock pulses appearing in such a manner as illustrated in FIG. 8M. The 1-bit eliminator 47 passes therethrough the clock pulses from the AND gate 34 while eliminating the leading pulse, so that clock pulses appearing in such a manner as shown in FIG. 8N are applied through the input selective counter 50 to the binary counter 52.

Referring now to FIG. 9 and FIGS. 10A through 10E, the operation of the converting circuit 55 will be explained in more detail.

Figure 9:
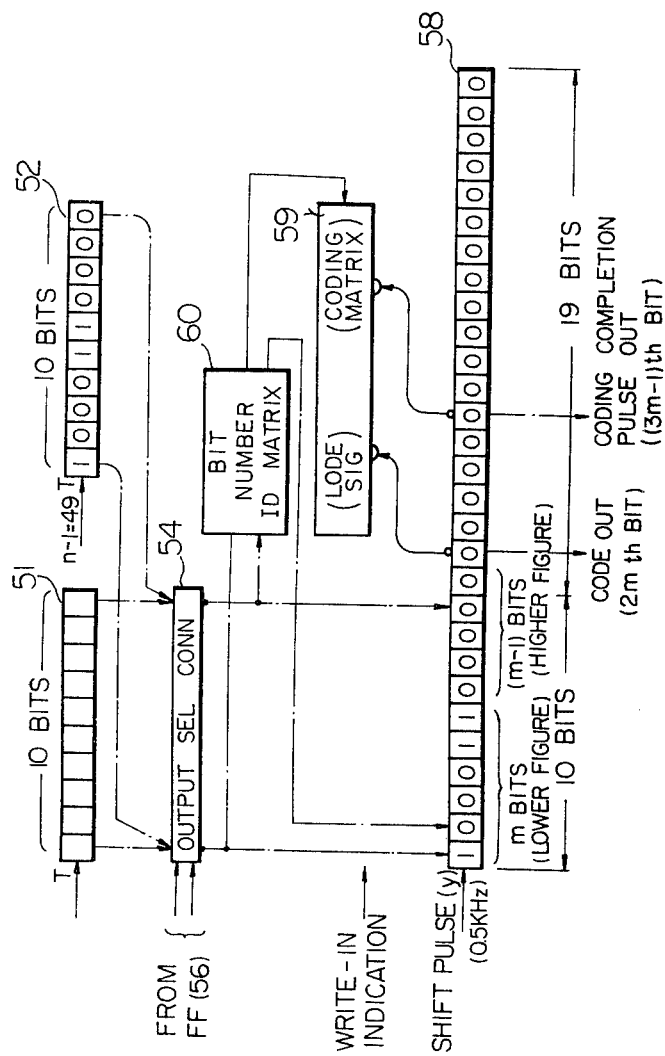
FIG. 9 is a diagram for the explanation of the operation of a converting circuit of the transmitter of FIGS. 5a, 5b and 5c.

When, for example, each of the binary counters 30, 33, 51 and 52 has a capacity of 10 bits, the parallel-in series-out shift register 58 should have a capacity of at least twenty nine bits for the reason mentioned below. It is now intended to convert the binary code corresponding to the mark signal $M_2$ of the faximile signal of FIG. 8E. When the assumption is made that the mark signal $M_2$ has a run-length of 50 unit times, a binary code 110001 corresponding to 49 is memorized in the counter 52 as illustrated in FIG. 9. The binary code 110001 is then transferred by way of the output selective connector 54 to the shift register 58 when the shift register 58 receives a write-in pulse. The transferred binary code then forms the lower figure of the resultant code signal. When it is now assumed that the binary code has a length of $m$ bits, the lower figure of the resultant code signal has also a length of $m$ bits and the higher figure has a length of $(m-1)$ bits as seen from FIG. 9. The bit number identifying matrix 60, on the other hand, detects the bit number $m$ of the binary code and furnishes with the bit number information to the coding matrix 59 which then has its code signal output terminal connected to an output terminal of $2m$-th bit of the shift register 59 and its coding completion pulse output terminal connected to an output terminal of $(3m-1)$ bit as illustrated in FIG. 9.

When the horizontal deflection voltage has such a waveform as shown in FIG. 10A, the shift pulse train appears in such a manner as illustrated in FIG. 10B. Since, with the above-mentioned arrangement, the shift pulses are applied to the shift register 58, a code signal having such a waveform as shown in FIG. 10C appears at the code signal output terminal of the coding matrix 59. Since the leading bit of the code signals according to the particular coding system is always a logic 1, a logic 1 signal appears at the coding completion signal output terminal of the coding matrix when the leading bit of the binary code shifted to the $(3m-1)$-th bit position of the shift register 58. Thus, the coding completion pulses appear in such a manner as illustrated in FIG 10D. Accordingly, the flip-flop circuit 44 produces gate pulses appearing in such a manner as illustrated in FIG. 10E, so that the space signal $S_3$ and the mark signal $M_3$ are respectively read by the transmitter during the gate pulses.

It should be now appreciated that although the coder 14 of FIG. 5C includes merely two counters 51 and 52, the coder 14 may include more than two counters if preferred. In this case, the coder 14 should includes address signal generator for producing address signals each assigned to each counter in stead of mark and space identifying circuit, that is, the flip-flop circuit 40 and furthermore the input and output selective connectors 50 and 54 should be respectively so arranged to establish connections between the output terminal of the run-length pulse generator 13 and the input terminals of one or more of the counters and between the output terminals of the one or more of the counters and the input terminals of the converting circuit 55 in accordance with the address signals. A ring counter may be used for the address signal generator which is arranged to be triggered by the code completion pulse signal.

It is to be noted that since the transmitter according to the present invention includes at least two counters, one of the counters cooperates with the converting circuit 55 so as to produce a binary code signal while the other counter counts and memorizes the run-length pulse signal, so that the transmitter of the invention is capable of more rapidly transmitting the binary code signals without increasing the horizontal scanning speed. Whereas, the conventional transmitter of run-length type includes only one counter and it cannot increase its transmission speed without increasing the horizontal scanning speed. In order to increase the horizontal scanning speed, the repetition frequency of the clock pulse train should be raised which invites such a problem that the transmitter is subject to erroneous operation due to increase delay times of various signals appearing therein or otherwise the transmitter should be constructed with devices of high-speed response. The increase of the scanning speed, furthermore, results in reduction of the S/N ratio of the output signal of the faximile signal generator or necessitates speed-up in the feeding mechanism of the faximile signal generator.

Figure 11:
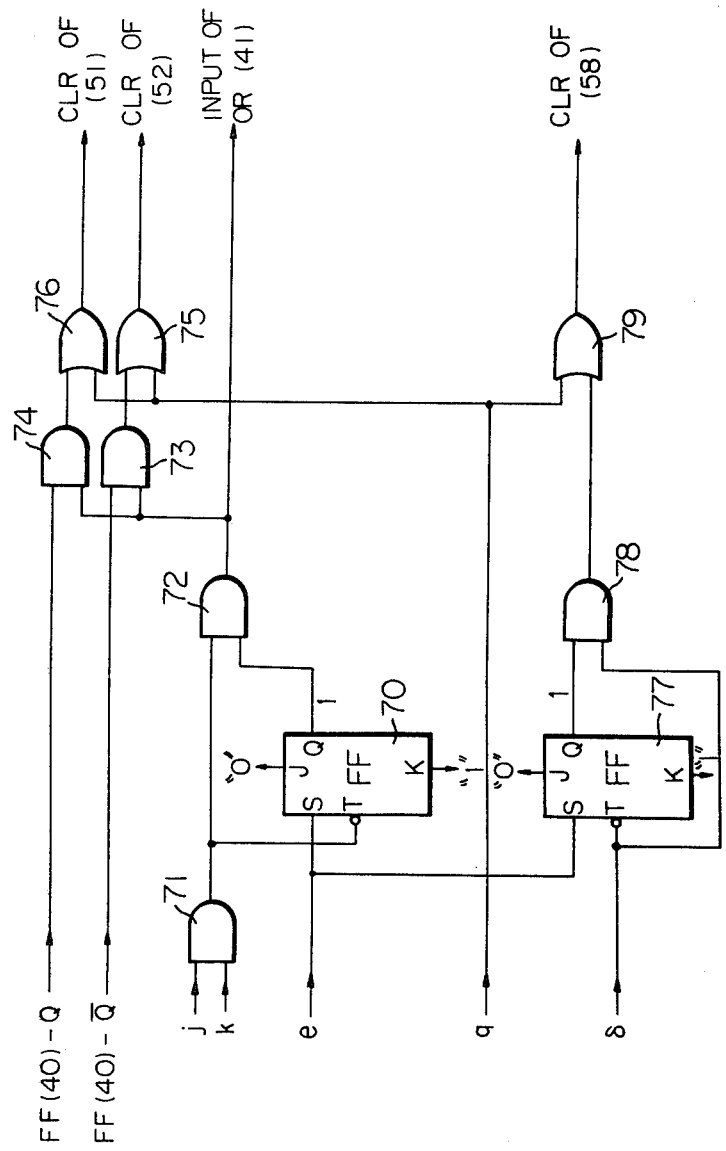
FIG. 11 is a diagram showing a circuit arrangement for a part of the transmitter of FIGS. 5a, 5b and 5c.

In FIG. 11, there is shown a preferred circuit arrangement for the clear pulse generator 53 of the transmitter of FIGS. 5A, 5B and 5C. The circuit arrangement includes a flip-flop circuit 70 having its set terminal connected to the coding completion pulse output terminal e of the coding matrix 59 and its trigger terminal connected to an output of an AND gate 71 which has its input connected to the blanking pulse output terminal and the write-in timing pulse output terminal of the pulse generator 11. The output of the AND gate 71 is also connected to one input of an AND gate 72 the other input of which is connected to a Q terminal of the flip-flop circuit 70. As an output of the AND gate 72 is connected to one input of an AND gate 73 and to one input of an AND gate 74. The remaining inputs of the AND gates 73 and 74 are respectively connected to the Q and $\bar{Q}$ output terminals of the flip-flop circuit 40. The AND gate 73 has its output connected to one input of an OR gate 75 and the AND gate 74 has its output connected to one input of an OR gate 76. The remaining inputs of the OR gates 75 and 76 are connected to the clear pulse output terminal q of the vertical scanning controler 35. Outputs of the OR gates 75 and 76 are respectively connected to the clear terminals of the binary counters 52 and 51. The circuit arrangement further includes a flip-flop circuit 77 having its trigger terminal connected to the clear pulse output terminal of the pulse generator 11 and its set terminal connected to the coding completion signal output terminal e of the coding matrix 59. The flip-flop circuit 77 has its output Q terminal connected to one input of an AND gate 78 the other input of which is connected to the clear pulse output terminal of the pulse generator 11. The AND gate 78 has its output connected to one input of an OR gate 79 the other input of which is connected to the clear pulse output terminal q of the vertical scanning controler 35. The OR gate 79 has its output connected to the clear terminal of the shift register 58. The output of the AND gate 72 is connected to one input of the OR gate 41 of the run-length pulse signal generator 13.

FIGS. 12A through 12E respectively show waveforms of the shift pulse train y, the horizontal synchronizing pulse train i, the blanking pulse train j, the clear pulse train δ, and the write-in timing pulse train k. The AND gate 71 passes therethrough the write-in pulse train k when it is triggered by the blanking pulses, so that such pulses as shown in FIG. 12F appear on the output of the AND gate 71. When, on the other hand, a coding completion pulse appear, the flip-flop circuit 70 is set by the coding completion pulse so as to produce a logic 1 signal on its output. Accordingly, the write-in pulse passed through the AND gate 71 further passes through the AND gate 72 and applied through the OR gate 41 to the flip-flop circuit 40 which is then inverted to produce a logic 1 signal on its either Q or $\bar{Q}$ terminal as shown in FIG. 12H. It is now to be noted that the flip-flop circuit 70 is triggered to invert its state at the trailing edge of the write-in timing pulse k passed through the AND gate 71. The write-in timing pulse passed through the AND gate 72 is also applied to the AND gates 73 and 74 one of which then passes therethrough the write-in timing pulse. The write-in timing pulse from the AND gate 73 or 74 further passes through either one of the OR gates 75 and 76 as shown in FIG. 12J. The flip-flop circuit 77 is, on the other hand, set by the coding completion pulse and inverted at the trailing edge of the clear pulse δ, so that such a pulse as shown in FIG. 12K appears on the output of the OR gate 79.

When a coding completion pulse appears in such a timing as shown in FIG. 12L, no signal appears at the output of the AND gate 72 although the flip-flop circuit 70 is set by the coding completion pulse. When, thereafter, one of the write-in timing pulses appears on the output of the AND gate 71, the AND gate produces an output pulse which triggers the flip-flop circuit 40 as indicated by FIG. 12M, so that either one of the OR gates 75 and 76 produces such an output pulse as shown in FIG. 12N. The OR gate 79, however, produces an output pulse in the same manner as the coding pulse appears during blanking period.

Figure 13A:
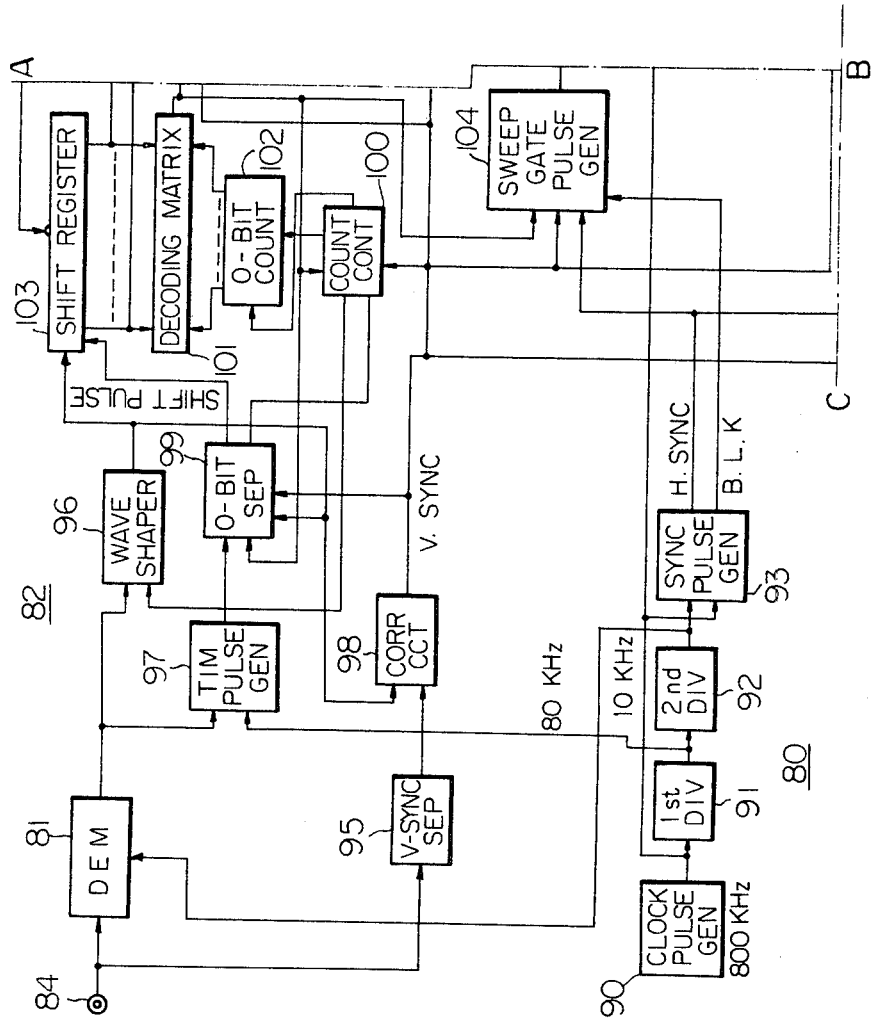
FIGS. 13a, 13b and 13c are block diagrams of a receiver in a facsimile system according to the present invention.
Figure 13B:
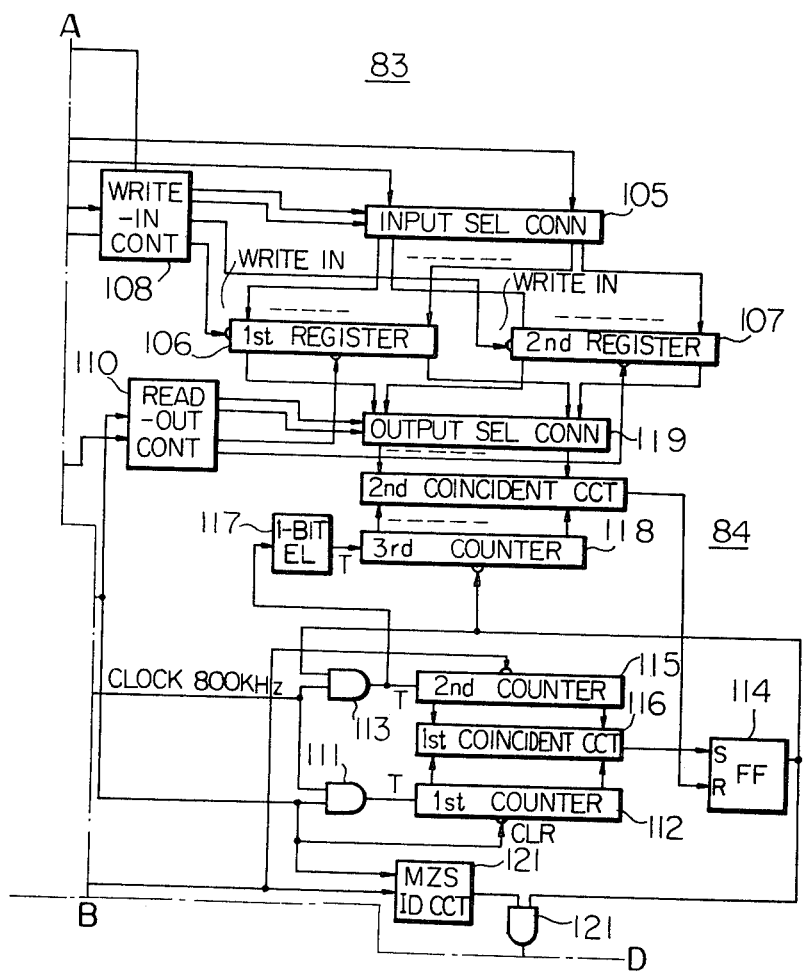
Figure 13C:
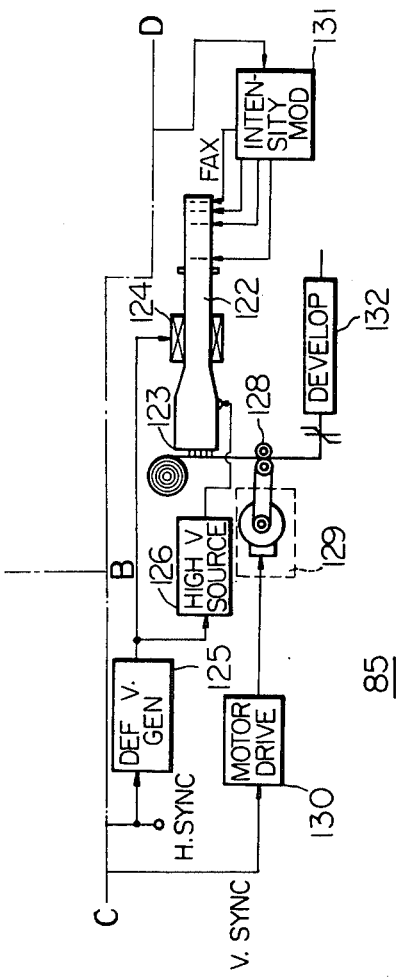

In FIGS. 13a, 13b and 13c, there is shown a receiver of a facsimile system of run-length type according to the present invention. The receiver should cooperate with a transmitter adapted to produce a faximile signal in the form of successive binary code signals on the basis of the coding system of FIG. 3. The receiver can, of course, cooperate with a transmitter of a type different from the transmitter disclosed in FIGS. 5a, 5b and 5c. The receiver generally comprises a timing pulse generator 80 for producing a clock pulse train, a sub-carrier pulse signal, a horizontal synchronizing pulse train and a blanking pulse train, a demodulator 81 for demodulating modulated and transmitted binary code signals from a transmitter, a decoder 82 for decoding the demodulated binary code signals into binary codes each representing a run-length of mark or space signal, a memory circuit 83 for memorizing the binary codes, a reconverting circuit 84 for reconverting the binary codes into the original mark or space signals, and a recorder 85 for recording the mark or space signal on a recording medium such as a photosensitive sheet.

The timing pulse generator 80 includes a clock pulse generator 90 for producing a clock pulse train having a repetition frequency of, for example, 800 KHz. The clock pulse train is applied to a first divider 91 which divides the clock pulse train into a pulse train of a lower repetition frequency of, for example, 80 KHz. The pulse train from the first divider 81 is applied to a second divider 92 which divides the pulse train into a pulse train having a repetition frequency of, for example, 10 KHz. The clock pulse train and the pulse train from the second divider 92 are applied to a synchronizing pulse generator 93 which produces a horizontal synchronizing pulse train and a blanking pulse train.

The demodulator 81 receives by way of an input terminal 94 carrier waves modulated with successive binary code signals a vertical synchronizing pulse train and transmitted from a transmitter. The demodulator 81 demodulates the carrier waves thereby to produce the successive binary code signals and the vertical synchronizing pulse train. The demodulator 81 is preferably so arranged as to utilize the pulse train from the second divider 92 as a sub-carrier signal by modulating the pulse train with the received carrier waves and to, thereafter, envelope-detect the modulated sub-carrier signal thereby to produce the successive binary code signals and the vertical synchronizing pulse train.

The decoder 92 includes a vertical synchronizing pulse separator 95 for separating the vertical synchronizing pulse signal from the binary code signals. A wave-shaper 96 shapes the waveforms of the binary code signals and the vertical synchronizing pulse train from the demodulator 81. A timing pulse generator 97 is adapted to produce a timing pulse train in response to the binary code signals and the pulse train from the first divider 91. The timing pulse train is utilized in the following stages in order to correctly pick up or count the binary code signals notwithstanding such a high transmission speed as of 200 bit/sec. A correction circuit 98 produces vertical synchronizing pulses each falling down at a correct position in spite of delay of the separated vertical synchronizing pulses caused by an inherent property of the vertical synchronizing pulse separator 95. A higher 0-bit separator 99 applies pulses representing a number of higher 0 digits of a code signal to a counter controler 100 in accordance with the binary code signals, the timing pulse train, the vertical synchronizing pulse train and coincidence pulses from a decoding matrix 101. Namely, the high 0-bit separator 99 commences to produce pulses upon receipt of a coincidence pulse, that is, code division pulse from the decoding matrix 101 and stops to produce the pulses upon receipt of a leading 1 digit of a code signal. The higher 0-bit separator 99 also applies a shift pulse train in synchronism with the timing pulse train from the timing pulse generator 97. The counter controller 101 produces pulses of a number equal to that of the pulses applied thereto from the separator 99 in accordance with the timing pulse train from the generator 97. The counter controller 100 is disabled during a certain time interval by the vertical synchronizing pulse train. The higher 0-bit counter 102 counts the number of pulses applied thereto from the counter controller 100 and furnishes with information as to the bit number of the lower figure of the particular binary code signal. While being triggered by the shift pulse train, the shift register memorizes therein the lower figure bits of the particular code signal. When the bit number of the memorized lower figure bits in the shift register 103 coincides with the information from the higher 0-bit counter 102, the decoding matrix 101 produces the coincidence pulse or code division pulse on its output terminal. A sweep gate pulse generator 104 is adapted to produce a sweep gate pulse in accordance with the code division pulse from the decoding matrix 101, the vertical synchronizing pulse, the horizontal synchronizing pulse and the blanking pulse.

A memory circuit 83 includes an input selective connector 105 adapted to selectively connects the output terminals of the shift register 103 to input terminals of one of first and second registers 106 and 107 in accordance with a write-in address signal from a write-in controller 108. The write-in controller 108 is adapted to alternately apply a write-in indication pulse to a trigger terminal of either one of the first and second registers 106 and 107, which then receives and memorizes the information of the shift register 103 by way of the input selective connector 105. The write-in controller 108 produces the write-in address signal and write-in indication signal in accordance with the code division pulse and the vertical synchronizing pulse. The write-in controller 108 produce a clear pulse upon completion of registration of one of the registers 106 and 107, the clear pulse being applied to the clear terminal of the shift register 103. An output selective connector 109 is adapted to selectively connect the output terminals of either one of the first and second register 106 and 107 to input terminals of the recovering circuit 84 in accordance with a read-out address signal from a read-out controller 110. The read-out controller 110 produces the read-out address signal on one of its output terminals in accordance with the vertical synchronizing pulse and the sweep gate pulse. The read-out controller 110 is adapted to alternately apply a clear pulse to the clear terminal of one of the first and second registers 106 and 107.

The reconverting circuit 84 includes an AND gate 111 for passing therethrough the clock pulses as long as it is triggered by the sweep gate pulse from the sweep gate pulse generator 104 of the coder 82. The clock pulses passed through the AND gate 111 are counted and memorized by a first counter 112. The first counter 112 receives the sweep gate pulse through its clear terminal so that it is cleared by the falling down of the sweep gate pulse. An AND gate 113 passes therethrough the clock pulses as long as it is triggered by an output pulse, that is, a mark or space pulse from a flip-flop circuit 114. The clock pulses passed through the AND gate 113 are applied to the trigger terminal of a second counter 115 which is so arranged as to be cleared by the vertical synchronizing pulse. When the memorized numbers of the clock pulses in the first and second counters 112 and 115 are coincident with each other, a first coincident circuit 116 produces a coincidence pulse which is applied to the set terminal of the flip-flop circuit 114. With the above-stated arrangement, the second counter 115 accumulatively memorizes the numbers corresponding to the run-lengths produced by the flip-flop circuit 114. The clock pulses passed through the AND gate 113 are also applied by way of a 1-bit eliminator 117 to the trigger terminal of a third counter 118 which is, on the other hand, cleared by the trailing edge of each output pulse of the flip-flop circuit 114. When contents memorized in the third counter 118 and a selected one of the registers 106 and 107 are coincident with each other, a second coincident circuit 119 produces a coincidence pulse which resets the flip-flop circuit 114. A mark and space identifying circuit 120 produces a logic "1" signal in accordance with the code division pulses and the vertical synchronizing pulses when a mark signal is to be reproduced. Thus, an AND gate 121 passes therethrough only the mark pulses from the flip-flop circuit 114 when it is triggered by the logic 1 pulses from the mark and space identifying circuit 120.

The recorder 75 includes a flying-spot tube 122 with a fibre optics faceplate 123 and a horizontal deflection element 124. The flying-spot tube 122 is so arranged as to produce a flying spot moving in one direction on its faceplate 123 when the deflection element 124 is energized by a saw-tooth wave deflection voltage from a deflection voltage generator 125 and an acceleration high voltage from a high voltage source 126 is applied to an electrode of the tube 122. A recording medium 127 is fed in close proximity to the faceplate 123 by a feeder 128 such as a pair of rollers which is actuated intermittently by a prime mover 129. The prime mover 129 is energized by a motor driver 130 which is energized by the vertical synchronizing pulses. An intensity modulator 131 modulates the intensity of the flying spot of the tube 122 in accordance with the mark pulses passed through the AND gate 121, so that the mark pulses are successively recorded on the recording medium. The recording medium 127 which is exposed to the modulated flying spot is thereafter processed by a suitable means such as a developer 132.

Referring now to FIGS. 14A through 14R, the operation of the receiver of FIGS. 13a, 13b and 13c will be explained hereinbelow.

When the received signal has such a waveform as illustrated in FIG. 14A, the demodulated signal from the demodulator 81 has such a waveform as shown in FIG. 14B. As seen from FIG. 14B, the successive code signals $S_0$, $S_1$, $S_2$, ... and $M_1$, $M_2$, $M_3$, ... respectively representing the run-lengths of mark and space images lying on a 1-H line are interposed between the adjacent two vertical synchronizing pulses. The vertical synchronizing pulses produced by the correction circuit 98 has such a waveform as shown in FIG. 14C. The timing pulse train generated by the timing pulse generator 97 has such a waveform as shown in FIG. 14D. When the shift register 103 memorizes the whole digits of the lower figure of each of the binary code signals, the coding matrix 101 produces the code division pulses appearing in such manners as illustrated in FIG. 14E. Accordingly, the write-in controller 108 alternately applies the write-in pulses to the registers 106 and 107. FIGS. 14F and 14G respectively illustrate waveforms of write-in pulse trains which are respectively applied to the registers 106 and 107. The write-in pulse controller 108 further produces the write-in address signal which may have a higher voltage when the first register 106 is selected and a lower voltage when the second register 107 is selected, as shown in FIG. 14H. Thus, the contents memorized in the shift register 103 are alternately transferred by way of the selective connector 105 to the registers 106 and 107. Since, on the other hand, the synchronizing pulse generator 93 produces the horizontal synchronizing pulses appearing in such manners as shown in FIG. 14J, the sweep gate pulse generator 104 produces the sweep gate pulses appearing in such manners as shown in FIG. 14K. Each of the sweep gate pulses has a pulse width equal to the effective horizontal scanning interval of, for example, 880 $\mu$s. The sweep gate pulses trigger the AND gate 111 which then passes therethrough the clock pulses. When the first counter 112 receives the clock pulses of the same number as that of the clock pulses memorized in the second counter 115, the coincident ciruict 116 produces a coincidence pulse which make the flip-flop circuit 114 to produce a logic 1 signal. Thus, the AND gate 113 commences to pass therethrough the clock pulses which are applied to the second counter 115 and through the 1-bit eliminator 117 to the third counter 118. The sweep gate pulses are also applied to the read-out controller 110 which then produces the read-out address signal. The read-out address signal may have a higher voltage when the register 106 is selected and a lower voltage when the register 107 is selected as shown in FIG. 14L. Thus, the output terminals of selected one of the registers 106 and 107 are connected by way of the output selective connector 109 to the input terminals of the second coincident circuit 119. When the content of the third counter 118 becomes equal to that of the selected one of the registers 106 and 107, the coincident circuit 119 produces a coincidence pulse which resets the flip-flop circuit 114, so that the flip-flop circuit 114 produces a pulse having a pulse width equal to the run-length of a code signal memorized in the selected one of the registers 106 and 107. The read-out controller 110 produces clear pulse trains respectively appearing in such manners as shown in FIGS. 14M and 14N. The clear pulse trains respectively applied to the registers 106 and 107 which are alternately cleared by the clear pulses. The sweep gate pulses are also applied to the mark and space identifying circuit 120 which then produces logic 1 signals appearing in such manner as shown in FIG. 14P, when the flip-flop circuit 114 produces output pulses corresponding to mark signals. The AND gate 121 thus passes therethrough only mark pulses which appear in such manner as shown in FIG. 14Q. When the deflection voltage from the generator 125 has such a waveform as shown in FIG. 14R, the mark pulses are respectively recorded on the recording medium during horizontal scanning intervals as indicated by $HM_1$, $HM_2$, $HM_3$, $HM_4$, ... in FIG. 14R.

It is now to be understood that although the memoray circuit 83 mentioned above includes merely two registers 106 and 107, the memory circuit 83 may include more than two registers if preferred. In this case, the write-in controller 108 should have more than two output terminals respectively connected to the trigger terminals of the more than two registers and the write-in controller 108 is so arranged as to produce address signals on its output terminals.

In FIG. 15, a preferred circuit arrangement for the write-in controller 108 for an $n$ number of registers is illustrated which includes a ring counter 140, and an $n$ number of AND gates $G_1$, $G_2$, ... and $G_n$. The input terminals of the ring counter 140 are respectively connected to the output terminal of the coding matrix 101 and the correcting circuit 98 for receiving the code division pulses and the vertical synchronizing pulses. Each of the AND gate $G_1$, $G_2$, ... and $G_n$ has its one input connected to each of the output terminals of the ring counter 140 and the other input terminal connected to the output terminal of the coding matrix 101. The output terminals of the AND gates are respectively connected to the output terminals $A_1$, $A_2$, ... and $A_n$ of the write-in controller 108.

FIGS. 16A through 16H respectively illustrates waveforms of various signals appearing in the circuit of FIG. 15.

It should be now appreciated that since the receiver according to the present invention includes a memory circuit including at least two registers, the memory circuit uses one of the registers for receiving information from the coder while, at the same time, using the other register for reconverting a memorized binary code signal into a mark or space signal, whereby the receiver according to the invention is capable of recording the mark signal on a recording medium in a desired recording speed.

When, for example, the transmission speed is 2,000 bit/sec, the shortest lower figure code, which is 2 bits, has such a short length as 1 ms. When, in this case, the shortest codes successively received, the receiver should reproduce each mark signal during an interval shorter than 0.5 ms, which invites difficulty that the exposure period too short to clearly record on the recording medium in case the receiver includes merely one register. Since, on the other hand, the receiver of the invention includes at least two registers, it can lengthen the reproduction interval up to at least 1 ms.

While there has been described a preferred embodiment of the invention it will be understood that various modifications and rearrangement may be made without departing from the scope and the spirit of the invention as defined by the appended claims.

What is claimed is:

1. In a facsimile transmitter of the type including a facsimile signal generator for developing constant rate facsimile signals comprised of space and mark signals respectively representing space and mark information of an image along a scan line; a pulse generator for generating a sampling pusle train; means receptive of said space and mark signals and responsive to a coding completion signal for developing run-length pulses having durations representative of the durations of said space and mark signals; a sampler receptive of said sampling pulse train and responsive to said run-length pulses for passing said sampling pulses therethrough when enabled by said run-length pulses; counter means for counting those of said sampling pulses passed by said sampler and for storing the count; and a coder for coding the count stored in said counter means into a binary code signal and for developing the coding completion signal when the coding is complete; wherein said counter means comprises:
- at least two counters for counting sampling pulses and storing the count therein;
- input selector means responsive to said coding completion signal for connecting the output of said sampler to one of said counters and for connecting the output of said sampler to a different one of said counters upon the occurrence of each coding completion signal; and
- output selector means responsive to said coding completion signal for connecting the input of said coder with the output of the one of said counters having a count of sampling pulses stored therein and for connecting the input of said coder with the output of another one of said counters having a count of sampling pulses stored therein upon the occurrence of each coding completion signal.

2. In a facsimile receiver including a decoder for decoding an encoded facsmile signal into a digital word corresponding to the run-length of a mark or space signal; storing and counting means for storing therein said digital word; a timing pulse generator for producing a timing pulse train at a constant repetition rate; a converter for receiving and converting the stored digital work into a run-length pulse in synchronism with said timing pulse train; and a recorder for recording a line image having a length determined by said run-length pulse on a recording medium in synchronism with said timing pulse train; wherein said storing and counting means comprises:
- at least two registers each for storing therein a digital word developed by said decoder;
- input selector means responsive to said timing pulse train for connecting the output of said decoder with the input of one of said registers and for connecting said decoder output to another said registers in synchronism with said timing pulse train; and
- output selector means responsive to said timing pulse train for connecting the input of said converter with the output of one of said registers having a digital word stored therein and for connecting the input of said converter with the output of another one of said registers having a digital work stored therein in synchronism with said timing pulse train.

* * * * *